(12) United States Patent
Kim et al.

(10) Patent No.: US 8,753,920 B2
(45) Date of Patent: Jun. 17, 2014

(54) PRECURSOR COMPOSITION FOR OXIDE SEMICONDUCTOR AND METHOD OF MANUFACTURING THIN FILM TRANSISTOR ARRAY PANEL USING THE SAME

(75) Inventors: Bo Sung Kim, Seoul (KR); Doo-Hyoung Lee, Suwon-si (KR); Yeon-Taek Jeong, Seoul (KR); Ki-Beom Lee, Seoul (KR); Young-Min Kim, Yongin-si (KR); Tae-Young Choi, Seoul (KR); Seon-Pil Jang, Seoul (KR); Kang-Moon Jo, Seoul (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/195,444

(22) Filed: Aug. 1, 2011

(65) Prior Publication Data

US 2012/0244667 A1    Sep. 27, 2012

(30) Foreign Application Priority Data

Mar. 22, 2011   (KR) .................... 10-2011-0025304

(51) Int. Cl.
    *H01L 21/36*       (2006.01)
(52) U.S. Cl.
    USPC ............. 438/104; 257/E21.09; 257/E21.411; 257/E21.461; 257/E21.464; 438/149; 438/151; 438/478; 438/493
(58) Field of Classification Search
    USPC .............. 257/E21.09, E21.411, E21.461, 257/E21.464; 438/104, 149, 151, 478, 493
    See application file for complete search history.

(56) References Cited

U.S. PATENT DOCUMENTS

| | | | | |
|---|---|---|---|---|
| 4,622,360 | A * | 11/1986 | Gomi et al. | 524/507 |
| 6,221,140 | B1 * | 4/2001 | Kobayashi et al. | 106/31.43 |
| 2008/0035898 | A1 * | 2/2008 | Tsuchiya et al. | 252/600 |
| 2008/0296567 | A1 | 12/2008 | Irving et al. | |
| 2010/0120197 | A1 * | 5/2010 | Levy et al. | 438/104 |
| 2010/0184253 | A1 | 7/2010 | Hirai et al. | |
| 2010/0266697 | A1 * | 10/2010 | Dunbar | 424/489 |

FOREIGN PATENT DOCUMENTS

| | | |
|---|---|---|
| JP | 2001-244464 | 9/2001 |
| JP | 2003-179242 | 6/2003 |
| JP | 2010-010549 | 1/2010 |
| JP | 2010-171237 | 8/2010 |
| JP | 2010-182852 | 8/2010 |
| KR | 1020080027276 A | 3/2008 |
| KR | 1020080101734 A | 11/2008 |

(Continued)

OTHER PUBLICATIONS

Hess, "Pressure—Temperature Sensors: Solution deposition of Rare—Earth—Doped Garnet Films", J. Non—Ccrystalline Solids, vol. 178 (1994), pp. 91-97.*

(Continued)

*Primary Examiner* — Asok K Sarkar
(74) *Attorney, Agent, or Firm* — F. Chau & Associates, LLC

(57) ABSTRACT

Provided is a precursor composition for an oxide semiconductor. The precursor composition for the oxide semiconductor includes a metal complex compound formed by a metal ion and an organic ligand, wherein the precursor composition is represented by the following Formula 1.

MAn                                (Formula 1)

Herein, M is a metal ion, A is an organic ligand which includes α-substituted carboxylate, and n is a natural number.

17 Claims, 3 Drawing Sheets

(56) References Cited

FOREIGN PATENT DOCUMENTS

| KR | 10-2011-0025334 | * | 3/2010 |
| KR | 10-0960808 B | | 5/2010 |
| KR | 1020100953828 A | | 8/2010 |
| KR | 1020100112522 A | | 10/2010 |
| KR | 1020110107130 | | 9/2011 |

OTHER PUBLICATIONS

Bluthardt et al., "Aqueous Synthesis of High Surface Area Metal Oxide", Catalysis Today 137 (2008), 132-143.*

* cited by examiner

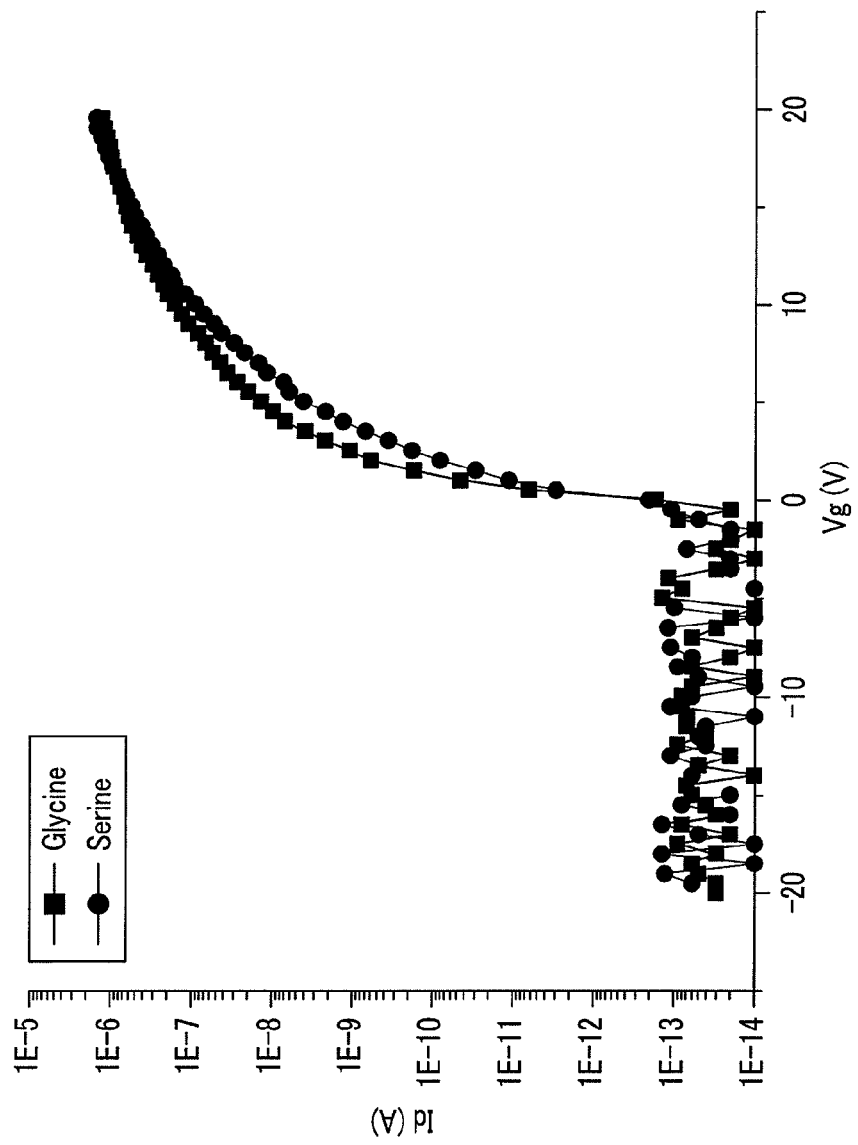

PRECURSOR COMPOSITION FOR OXIDE SEMICONDUCTOR AND METHOD OF MANUFACTURING THIN FILM TRANSISTOR ARRAY PANEL USING THE SAME

CROSS-REFERENCE TO RELATED APPLICATION

This application claims priority to Korean Patent Application No. 10-2011-0025304 filed on Mar. 22, 2011, the entire disclosure of which is hereby incorporated by reference herein in its entirety.

BACKGROUND OF THE INVENTION (a) Technical Field

The present disclosure relates to a precursor composition for an oxide semiconductor and a method of manufacturing a thin film transistor array panel using the same.

(b) Description of the Related Art

A liquid crystal display as one of flat panel display devices that are widely being used includes two substrates where electrodes are formed and a liquid crystal layer interposed therebetween and liquid crystal molecules of the liquid crystal layer are rearranged by applying voltage to the electrodes and an amount of transmitted light is adjusted, thereby displaying an image.

In general, the liquid crystal display includes a thin film transistor for switching each pixel. The thin film transistor may form a switching element including a gate electrode receiving a switching signal, a source electrode applied with data voltage, and a drain electrode outputting a data electrode as a three-terminal. In addition, the thin film transistor may include an active layer overlapping the gate electrode, the source electrode, and the drain electrode as a channel layer and in the active layer, amorphous silicon is usually used as a semiconductor material.

However, as the displays have become gradually larger, development of a thin film transistor capable of driving at more rapid speeds may be required. For example, amorphous silicon usually used as the active layer at present has low electron mobility degree and may require deposition equipment based on a high-priced vacuum process for applying a chemical vapor deposition (CVD) method, a sputtering method, and the like.

Therefore, to increase the electron mobility degree and perform a coating process or a very low-priced printing process, the development of an oxide semiconductor material capable of performing a solution process may be required.

The above information disclosed in this Background section is only for enhancement of understanding of the background of the invention and therefore it may contain information that does not form the prior art that is already known in this country to a person of ordinary skill in the art.

SUMMARY OF THE INVENTION

However, to form an oxide semiconductor by a solution process, the heat-treatment at a high temperature of 400° C. or more may be required such that energy consumption is large.

Exemplary embodiments of the present invention may provide a precursor composition for an oxide semiconductor having the benefits of having a thin film transistor characteristic in a low-temperature process and a method of manufacturing a thin film transistor array panel using the same.

An exemplary embodiment of the present invention provides a precursor composition for an oxide semiconductor including a metal complex compound formed by a metal ion and an organic ligand and represented by the following Formula 1.

$$MA_n \qquad \text{Formula 1}$$

Herein, M is the metal ion, A is the organic ligand and includes α-substituted carboxylate, and n is a natural number.

In Formula 1, A may include at least one of α-substituted amino acid, α-substituted hydroxyl acid, α-substituted keto acid, and α-substituted thio acid.

Formula 1 may include a compound represented by the following Formula 2.

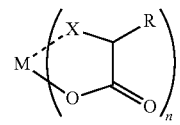

Formula 2

Herein, M may be the metal ion, X may be at least one of $NH_2$, OH, O, and SH, R may be hydrogen (H) or an alkyl group, and n may be 1 to 3.

The metal ion may include at least one of zinc (Zn), tin (Sn), indium (In), gallium (Ga), lithium (Li), sodium (Na), potassium (K), rubidium (Rb), cesium (Cs), beryllium (Be), aluminum (Al), barium (Ba), zirconium (Zr), hafnium (Hf), vanadium (V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), gold (Au), mercury (Hg), boron (B), thallium (Tl), silicon (Si), phosphorus (P), arsenic (As), lanthanum (La), cerium (Ce), gadolinium (Gd), neodymium (Nd), tellurium (Te), scandium (Sc), polonium (Po), praseodymium (Pr), terbium (Tb), dysprosium (Dy), holmium (Ho), europium (Eu), erbium (Er), and ytterbium (Yb).

A mole ratio of the metal ion and the organic ligand may be about 1:0.2 to about 1:10.

The α-substituted amino acid may include at least one of alanine, serine, glycine, cysteine, proline, and sarcosine.

The α-substituted hydroxyl acid may include one of 2-hydroxy acetic acid and lactic acid.

The α-substituted keto acid may include one of pyruvic acid and glyoxylic acid.

The α-substituted thio acid may include one of thiolactic acid and thioglycolic acid.

The precursor composition may further include at least one of water, ether and alcohol.

An exemplary embodiment of the present invention provides a method of manufacturing a thin film transistor array panel including: preparing a metal compound solution which includes a metal complex compound formed by a metal ion and an organic ligand and a solvent, coating the metal compound solution on a substrate and heat-treating the metal compound solution coated on the substrate, in which the metal complex compound is represented by the following Formula 1.

$$MA_n \qquad \text{Formula 1}$$

Herein, M is the metal ion, A is the organic ligand and includes α-substituted carboxylate, and n is a natural number.

The method may further include preprocessing the metal compound solution coated on the substrate before heat-treating the metal compound solution.

The preprocessing of the metal compound solution may include irradiating ultraviolet rays thereon.

The heat-treating of the metal compound solution may be performed at the temperature of no greater than about 250° C.

In Formula 1, A may include at least one of α-substituted amino acid, α-substituted hydroxyl acid, α-substituted keto acid, and α-substituted thio acid.

Formula 1 may include a compound represented by the following Formula 2.

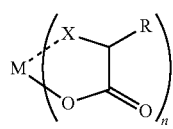

Formula 2

Herein, M may be a metal ion, X may be at least one of NH2, OH, O, and SH, R may be hydrogen (H) or an alkyl group, and n may be 1 to 3.

The metal ion may include at least one of zinc (Zn), tin (Sn), indium (In), gallium (Ga), lithium (Li), sodium (Na), potassium (K), rubidium (Rb), cesium (Cs), beryllium (Be), aluminum (Al), barium (Ba), zirconium (Zr), hafnium (Hf), vanadium (V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), gold (Au), mercury (Hg), boron (B), thallium (Tl), silicon (Si), phosphorus (P), arsenic (As), lanthanum (La), cerium (Ce), gadolinium (Gd), neodymium (Nd), tellurium (Te), scandium (Sc), polonium (Po), praseodymium (Pr), terbium (Tb), dysprosium (Dy), holmium (Ho), europium (Eu), erbium (Er), and ytterbium (Yb).

A mole ratio of the metal ion and the organic ligand may be about 1:0.2 to about 1:10.

The α-substituted amino acid may include at least one of alanine, serine, glycine, cysteine, proline, and sarcosine.

The α-substituted hydroxyl acid may include one of 2-hydroxy acetic acid and lactic acid.

The α-substituted keto acid may include one of pyruvic acid and glyoxylic acid.

The α-substituted thio acid may include one of thiolactic acid and thioglycolic acid.

An exemplary embodiment of the present invention provides a method of manufacturing a thin film transistor array panel which includes forming a gate electrode on an insulation substrate, forming a gate insulating layer on the gate electrode, forming a source electrode and a drain electrode on the gate insulating layer, forming a metal compound solution by mixing together a metal complex compound composed of a metal ion and an organic ligand and a solvent. The metal complex compound is represented by the following Formula 1:

MAn                                      Formula 1

(M is the metal ion, A is the organic ligand and includes α-substituted carboxylate, and n is a natural number). The method further includes coating the metal compound solution on the insulation substrate, preprocessing the metal compound solution coated on the insulation substrate by irradiating the metal compound solution with ultraviolet rays, heat-treating the metal compound solution at a temperature no greater than 250° C. after the preprocessing of the metal compound solution, cooling the metal compound solution at room temperature after the heat-treating of the metal compound solution to form an oxide semiconductor layer including metal oxide on the insulation substrate and etching the oxide semiconductor layer including metal oxide such that only a portion of the oxide semiconductor layer including metal oxide remains on the insulation substrate.

The coating of the metal compound solution on the insulating substrate may be performed after the source electrode and the drain electrode are formed on the gate insulating layer such that the metal compound solution is coated directly on the source electrode, the drain electrode and the gate insulating layer and the oxide semiconductor layer including metal oxide may be formed directly on the source electrode, the drain electrode and the gate insulating layer.

The coating of the metal compound solution on the insulating substrate may be performed after the gate insulating layer is formed on the gate electrode but prior to the source electrode and the drain electrode being formed on the gate insulating layer such that the metal compound solution is coated directly on the gate insulating layer and the oxide semiconductor layer including metal oxide may be formed directly on the gate insulating layer and the source electrode and the drain electrode are subsequently directly formed on the oxide semiconductor layer including metal oxide.

According to exemplary embodiments of the present invention, since the process is performed at a low-temperature of about 250° C. or less by using the precursor composition for the oxide semiconductor including the metal complex compound formed by the metal ion and the organic ligand, energy can be reduced and increased reliability can be acquired.

BRIEF DESCRIPTION OF THE DRAWINGS

FIG. 4 is a graph illustrating a transfer curve of a thin film transistor according to an exemplary embodiment of the present invention.

DETAILED DESCRIPTION OF EXEMPLARY EMBODIMENTS

Figure 1:
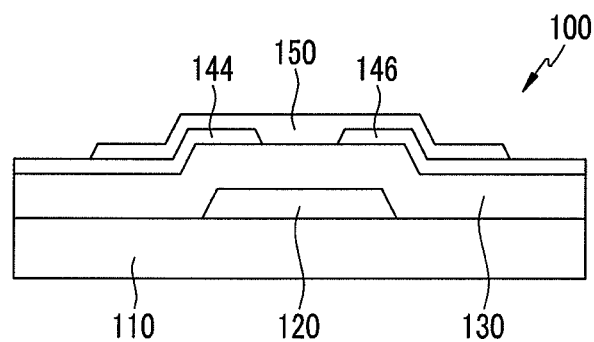
FIG. 1 is a cross-sectional view of a thin film transistor array panel according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention.

In the drawings, the thicknesses of layers, films, panels, regions, etc., are exaggerated for clarity. It will be understood that when a layer is referred to as being "on" another layer or substrate, it can be directly on the other layer or intervening layers may also be present. Like reference numerals designate like elements throughout the specification.

FIG. 1 is a cross-sectional view of a thin film transistor array panel according to an exemplary embodiment of the present invention.

Referring to FIG. 1, a thin film transistor array panel 100 includes, for example, an insulation substrate 110, a gate electrode 120, a gate insulating layer 130, a source electrode 144, a drain electrode 146, and an oxide semiconductor layer 150.

The gate electrode 120 which is a part of a gate wire for transferring a gate signal is disposed on the insulation substrate 110. The insulation substrate 110 may be, for example, a glass substrate, a plastic substrate, or the like but exemplary embodiments of the present invention are not limited thereto and the insulating substrate 110 may be made of other materials in accordance with exemplary embodiments of the present invention as is understood by one skilled in the art. The gate electrode 120 may be made of, for example, an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), tantalum (Ta), or the like.

In addition, the gate electrode 120 may have, for example, a multilayer structure including two conductive layers (not shown) having different physical properties. One conductive layer is made of a low-resistivity metal, such as for example, the aluminum-based metal, the silver-based metal, the copper-based metal, or the like so as to reduce signal delay or voltage drop. On the other hand, the other conductive layer is made of another material, having beneficial contact characteristics with zinc oxide (ZnO), indium tin oxide (ITO), and indium zinc oxide (IZO), such as for example, the molybdenum-based metal, chromium (Cr), titanium (Ti), tantalum (Ta), or the like. For example, the combination may be a chromium lower layer and an aluminum upper layer, an aluminum lower layer and a molybdenum upper layer, or a titanium lower layer and a copper upper layer.

However, exemplary embodiments of the present invention are not limited thereto and the gate electrode 120 may be made of various metals and conductors.

The gate insulating layer 130 is formed on the insulation substrate 110 and the gate wire including the gate electrode 120. The gate insulating layer 130 may be made of, for example, silicon oxide (SiOx), silicon nitride (SiNx), silicon oxynitride (SiON), or the like. In addition, the gate insulating layer 130 may have, for example, a multilayer structure in which silicon oxide and silicon nitride are stacked. In this case, a silicon nitride layer is formed above the insulation substrate 110 and a silicon oxide layer is formed above the silicon nitride layer such that the silicon oxide layer may be in contact with the oxide semiconductor layer to be described below.

Even in the case where a silicon oxynitride single layer is used, as the silicon oxynitride layer is adjacent to the oxide semiconductor layer, distribution of oxygen concentration may be set so that the composition ratio of oxygen in silicon oxynitride is increased. In this case, when the oxide semiconductor layer contacts the silicon oxide layer, the oxygen deficiency concentration in the oxide semiconductor may keep uniform, thereby preventing degradation of a channel layer. It is noted that the gate insulating layer 130 of exemplary embodiments of the present invention is not limited to the above construction and the gate insulating layer 130 may be made of various materials as is understood by one skilled in the art.

The source electrode 144 and the drain electrode 146 which are included in a data wire are disposed on the gate insulating layer 130. In addition, the oxide semiconductor layer 150 is disposed above the source electrode 144 and the drain electrode 146. A passivation layer (not shown) may be disposed above the oxide semiconductor layer 150. In the present exemplary embodiment, the gate electrode 120, the gate insulating layer 130, the source electrode 144, the drain electrode 146, and the oxide semiconductor layer 150 are sequentially stacked, but a layout order or position thereof may be differently formed.

The source electrode 144 and the drain electrode 146 are spaced apart from each other and at least partially overlap the oxide semiconductor layer 150. That is, the source electrode 144 at least partially overlaps the oxide semiconductor layer 150, and the drain electrode 146 at least partially overlaps the semiconductor layer 150 while facing the source electrode 144 based on a channel portion of the oxide thin film transistor.

The source electrode 144 and the drain electrode 146 may be made of a material forming an ohmic contact by directly contacting the oxide semiconductor layer 150 and when the source electrode 144 and the drain electrode 146 are made of a material having a work function smaller than a material constituting the oxide semiconductor layer 150, the ohmic contact between two layers may be formed. Meanwhile, in exemplary embodiments of the present invention, the thin film transistor array panel may further include an ohmic contact layer (not shown) formed only in a region where the oxide semiconductor layer 150 overlaps the source electrode 144 and the drain electrode 146. The ohmic contact layer acts to help to form the ohmic contact.

Like the gate electrode 120, the source electrode 144 and drain electrode 146 may be made of, for example, an aluminum-based metal such as aluminum (Al) and an aluminum alloy, a silver-based metal such as silver (Ag) and a silver alloy, a copper-based metal such as copper (Cu) and a copper alloy, a molybdenum-based metal such as molybdenum (Mo) and a molybdenum alloy, chromium (Cr), titanium (Ti), tantalum (Ta), or the like. In addition, the source electrode 144 and drain electrode 146 may be made of a transparent conductive material such as, for example, zinc oxide (ZnO), indium tin oxide (ITO), and indium zinc oxide (IZO).

Further, the data wire may have, for example, a multilayered structure including two different conductive layers (not shown) and an example of the combination may be a dual-layer such as Mo(Mo alloy)/Al(Al alloy), Ti(Ti alloy)/Al(Al alloy), Ta(Ta alloy)/Al(Al alloy), Ni(Ni alloy)/Al(Al alloy), Co(Co alloy)/Al(Al alloy), Ti(Ti alloy)/Cu(Cu alloy), Cu(Cu alloy)/Mn(Mn alloy), or the like, or a triple-layer such as Ti(Ti alloy)/Al(Al alloy)/Ti(Ti alloy), Ta(Ta alloy)/Al(Al alloy)/Ta(Ta alloy), Ti(Ti alloy)/Al(Al alloy)/TiN, Ta(Ta alloy)/Al(Al alloy)/TaN, Ni(Ni alloy)/Al(Al alloy)/Ni(Ni alloy), Co(Co alloy)/Al(Al alloy)/Co(Co alloy), Mo(Mo alloy)/Al(Al alloy)/Mo(Mo alloy), or the like.

For example, when Cu or a Cu alloy is applied as the data wire, since there is no large difficulty in ohmic contact characteristics of the data wire and the pixel electrode (not shown), a dual-layer with a layer including Mo, Ti or Ta between a Cu or Cu alloy layer and the oxide semiconductor layer 150 may be applied as the data wire. However, exemplary embodiments of the present invention are not limited thereto, and the source electrode 144 and the drain electrode 146 may be made of various metals and conductors.

The drain electrode 146 may be electrically connected with a pixel electrode (not shown), an electric field may be generated by voltage applied to the pixel electrode, and a gray can be expressed according to the electric field.

The oxide semiconductor layer 150 including metal oxide is formed above the source electrode 144 and the drain electrode 146. The oxide semiconductor layer 150 may further include, for example, a metal inorganic salt. The oxide semiconductor layer 150 overlaps the gate electrode 120, the gate insulating layer 130, the source electrode 144, and the drain electrode 146 and the gate insulating layer 130, the source electrode 144 and the drain electrode 146 are disposed between the oxide semiconductor layer 150 and the gate electrode 120. However, exemplary embodiments of the present invention are not limited to the above-mentioned positioning for the oxide semiconductor layer 150, the source electrode 144, drain electrode 146, the gate electrode 120, the gate insulating layer 130, but rather their positions may be varied as is understood by one skilled in the art. For example, the positions of the source electrode 144, the drain electrode 146 and the oxide semiconductor layer 150 may be switched such that the source electrode 144 and the drain electrode 146 may instead be positioned above the oxide semiconductor layer 150.

The oxide semiconductor layer 150 includes, for example, a metal complex compound formed by a metal ion and an organic ligand and is formed by coating and then heat-treating a metal compound solution including a precursor composition for the oxide semiconductor represented by the following Formula 1 and a solvent.

$$MA_n \quad \text{Formula 1}$$

Herein, M is a metal ion, A includes α-substituted carboxylate, and n is a natural number.

In Formula 1, A may include, for example, at least one of α-substituted amino acid, α-substituted hydroxyl acid, α-substituted keto acid, and α-substituted thio acid.

The α-substituted amino acid may include, for example, at least one of alanine, serine, glycine, cysteine, proline, and sarcosine.

The α-substituted hydroxyl acid may include, for example, 2-hydroxy acetic acid or lactic acid.

The α-substituted keto acid may include, for example, pyruvic acid or glyoxylic acid.

The α-substituted thio acid may include, for example, thiolactic acid or thioglycolic acid.

For example, Formula 1 may include a compound represented by the following Formula 2.

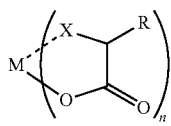

Formula 2

Herein, M may be a metal ion, X may be at least one of, for example, $NH_2$, OH, O, and SH, R may include at least one of hydrogen (H) or an alkyl group, and n may be 1 to 3.

The metal ion may include at least one of, for example, zinc (Zn), tin (Sn), indium (In), gallium (Ga), lithium (Li), sodium (Na), potassium (K), rubidium (Rb), cesium (Cs), beryllium (Be), aluminum (Al), barium (Ba), zirconium (Zr), hafnium (Hf), vanadium (V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), gold (Au), mercury (Hg), boron (B), thallium (Tl), silicon (Si), phosphorus (P), arsenic (As), lanthanum (La), cerium (Ce), gadolinium (Gd), neodymium (Nd), tellurium (Te), scandium (Sc), polonium (Po), praseodymium (Pr), terbium (Tb), dysprosium (Dy), holmium (Ho), europium (Eu), erbium (Er), and ytterbium (Yb).

A mole ratio of the metal ion and the organic ligand may be, for example, about 1:0.2 to about 1:10. The characteristic of the thin film transistor may be deteriorated if the above range of the mole ratio is not met.

The metal compound solution may further include, for example, a stabilizer. The stabilizer includes at least one selected from a group constituted by, for example, diketone, amino alcohol, and polyamine. It is noted that exemplary embodiments of the present invention are not limited to the above-mentioned stabilizers and that other stabilizers may also be used in accordance with exemplary embodiments of the present invention as is understood by one skilled in the art.

The solvent includes at least one selected from a group constituted by, for, water, ether, and alcohol. However, exemplary embodiments of the present invention are not limited thereto but rather other solvents may also be used in accordance with exemplary embodiments of the present invention as is understood by one skilled in the art.

Meanwhile, a passivation layer (not shown) may be disposed above the oxide semiconductor layer 150. The passivation layer may be, for example, a multilayer where silicon oxide (SiOx) and silicon nitride (SiNx) are stacked, and the degradation of the channel layer can be prevented by contacting the silicon oxide (SiOx) layer with the oxide semiconductor layer 150.

Figure 2:
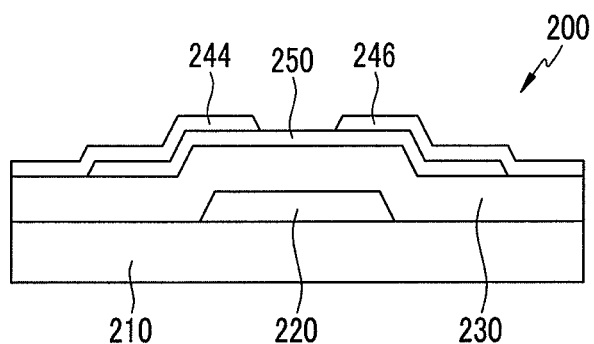
FIG. 2 is a cross-sectional view of a thin film transistor array panel according to an exemplary embodiment of the present invention.

Hereinafter, an exemplary embodiment of the present invention will be described with reference to FIG. 2. FIG. 2 is a cross-sectional view of a thin film transistor array panel according to an exemplary embodiment of the present invention.

Referring to FIG. 2, a thin film transistor array panel 200 includes, for example, an insulation substrate 210, a gate electrode 220, a gate insulating layer 230, a source electrode 244, a drain electrode 246, and an oxide semiconductor layer 250.

The gate electrode 220 which is a part of a gate wire for transferring a gate signal is disposed on the insulation substrate 210. The gate insulating layer 230 is disposed on the insulation substrate 210 and the gate electrode 220. The oxide semiconductor layer 250 is disposed above the gate insulating layer 230 so as to overlap the gate electrode 220. The source electrode 244 and the drain electrode 246 are disposed above the oxide semiconductor layer 250. That is, the source electrode 244 and the drain electrode 246 at least partially overlap the oxide semiconductor layer 250 and are spaced apart from each other. That is, the oxide semiconductor layer 250 is disposed between the gate insulating layer 230 and the source electrode 244 and the drain electrode 246. A passivation layer (not shown) including a silicon oxide layer may be disposed above the source electrode 244 and the drain electrode 246.

Since the description on the insulation substrate 210, the gate electrode 220, the gate insulating layer 230, the source electrode 244, the drain electrode 246, and the oxide semiconductor layer 250 which are constituent elements of the present exemplary embodiment is the same as that of exemplary embodiments described above, the detailed description thereon is omitted.

In exemplary embodiments described above, a bottom gate structure in which the gate electrode is disposed under the oxide semiconductor layer is described, but exemplary embodiments of the present invention are not limited thereto and a top gate structure in which the gate electrode is disposed above the oxide semiconductor layer may be also applied.

Hereinafter, a method of manufacturing a thin film transistor array panel according to an exemplary embodiment of the present invention will be described in detail.

Figure 3:
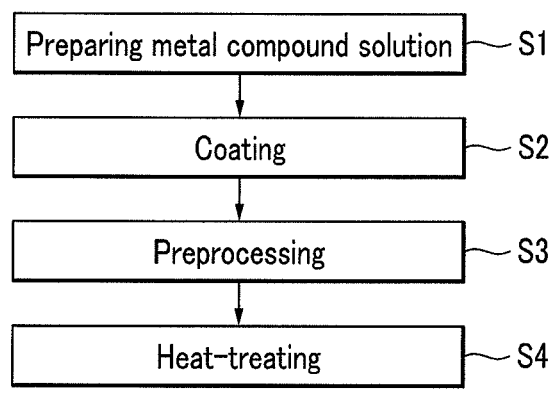
FIG. 3 is a flowchart illustrating a method of manufacturing an oxide semiconductor included in a thin film transistor array panel according to an exemplary embodiment of the present invention.

FIG. 3 is a flowchart illustrating a method of manufacturing an oxide semiconductor included in a thin film transistor array panel according to an exemplary embodiment of the present invention.

A method of manufacturing a thin film transistor array panel according to the present exemplary embodiment includes, for example, preparing a metal compound solution which includes a metal complex compound formed by a metal ion and an organic ligand and a solvent (S1), coating the metal compound solution on a substrate (S2), preprocessing the metal compound solution (S3), and heat-treating the metal compound solution (S4).

In the preparing of the metal compound solution (S1), a metal ionic salt compound is added and stirred in a predetermined solvent. The metal ionic salt compound is a metal complex compound formed by a metal ion and an organic ligand and a precursor composition for an oxide semiconductor represented by, for example, the following Formula 1.

$$MA_n \qquad \text{Formula 1}$$

Herein, M is a metal ion, A includes α-substituted carboxylate, and n is a natural number.

In Formula 1, A may include at least one of, for example, α-substituted amino acid, α-substituted hydroxyl acid, α-substituted keto acid, and α-substituted thio acid.

The α-substituted amino acid may include at least one of, for example, alanine, serine, glycine, cysteine, proline, and sarcosine.

The α-substituted hydroxyl acid may include, for example, 2-hydroxy acetic acid or lactic acid.

The α-substituted keto acid may include, for example, pyruvic acid or glyoxylic acid.

The α-substituted thio acid may include, for example, thiolactic acid or thioglycolic acid.

For example, Formula 1 may include a compound represented by the following Formula 2.

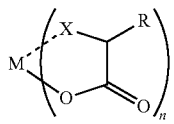

Formula 2

Herein, M may be a metal ion, X may be at least one of, for example, $NH_2$, OH, O, and SH, R may include hydrogen (H) or an alkyl group, and n may be 1 to 3.

The metal ion may include at least one of, for example, zinc (Zn), tin (Sn), indium (In), gallium (Ga), lithium (Li), sodium (Na), potassium (K), rubidium (Rb), cesium (Cs), beryllium (Be), aluminum (Al), barium (Ba), zirconium (Zr), hafnium (Hf), vanadium (V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), gold (Au), mercury (Hg), boron (B), thallium (Tl), silicon (Si), phosphorus (P), arsenic (As), lanthanum (La), cerium (Ce), gadolinium (Gd), neodymium (Nd), tellurium (Te), scandium (Sc), polonium (Po), praseodymium (Pr), terbium (Tb), dysprosium (Dy), holmium (Ho), europium (Eu), erbium (Er), and ytterbium (Yb).

A mole ratio of the metal ion and the organic ligand may be, for example, about 1:0.2 to about 1:10. The characteristic of the thin film transistor may be deteriorated if the above range of the mole ratio is not met.

The solvent includes at least one selected from a group constituted by water, ether, and alcohol. It is noted that exemplary embodiments of the present invention are not limited to the above-mentioned solvents and that other solvents may also be used in accordance with exemplary embodiments of the present invention as is understood by one skilled in the art.

Next, the coating of the metal compound solution on the substrate (S2) is performed. The substrate may be a substrate in which a channel layer is not formed at the thin film transistor array panel. That is, the substrate may be a substrate in which the gate electrode, the gate insulating layer, the source electrode, and the drain electrode are formed on the insulation substrate. In addition, the substrate may be a substrate in which the gate electrode and the gate insulating layer are formed on the insulation substrate. Exemplary embodiments of present invention are not limited thereto and a structure of the substrate may vary according to the structure of the thin film transistor to be manufactured.

The coating (S2) may be performed by using one of, for example, spin coating, dip coating, bar coating, screen printing, slide coating, roll coating, spray coating, slot coating, dip-pen, Inkjet, and nano dispensing methods. It is noted that exemplary embodiments of the present invention are not limited to the above-mentioned coating methods and that other methods for coating the metal compound solution on the substrate may also be used in accordance with exemplary embodiments of the present invention as is understood by one skilled in the art.

Next, the preprocessing of the substrate coated with the metal compound solution (S3) is performed. The preprocessing (S3) involves exposing the substrate coated with the metal compound solution to ultraviolet rays for a predetermined time. In this case, the ligand structure of the metal complex compound is partially broken to form the metal oxide.

Next, the heat-treating of the substrate coated with the metal compound solution (S4) is performed. The heat-treating (S4) is performed in the temperature range of about 250° C. or less.

When the heat treating temperature is less than about 100° C., the metal oxide is not smoothly formed and the manufactured oxide semiconductor layer cannot function as the channel layer of the thin film transistor well. When the heat treating temperature is more than about 250° C., the temperature becomes beyond the temperature range used in the entire processes of the thin film transistor array panel and a merit which can be obtained in the low temperature process is lost.

Other additives such as, for example, a solvent, a stabilizer, or the like of the metal compound solution are removed by performing the heat-treating (S4) to form the oxide semiconductor layer including metal oxide.

After the heat-treating (S4), leaving the formed oxide semiconductor layer only at a desired position may be performed by, for example, etching. The etching of the oxide semiconductor layer may be performed by various etching methods (e.g., dry etching, wet etching, and the like). According to the present exemplary embodiment, a photosensitive film is stacked on the oxide semiconductor layer, the photosensitive film is exposed and developed by a mask to form a defined pattern, and an etchant is provided based on the patterned photosensitive film and a wet etching is performed to form a desired pattern. Alternatively, for example, instead of wet etching, dry etching may be used to pattern the oxide semiconductor layer.

Hereinafter, a method of manufacturing the thin film transistor of exemplary embodiments of the present invention is described in detail through Examples, but the scope of the present invention is not limited to the following Examples.

EXAMPLE 1

The metal compound solution was prepared by stirring for a predetermined time after adding indium chloride (InCl3) and glycine in a solvent, ethanol.

A gate was formed with Mo/ITO metal and the gate insulating layer was formed with silicon oxide on a glass substrate, a source-drain was patterned and formed with ITO, and then, the metal compound solution was coated by a spin coating method on the ITO source-drain. Next, the metal compound solution was exposed to ultraviolet rays for approximately 20 minutes. Then, the metal compound solution was heat-treated at about 250° C. for about 1 hour. Thereafter, the metal compound solution was cooled at a room temperature for about 10 minutes to form an oxide thin film including indium oxide and the thin film transistor was manufactured by forming the oxide thin film as a channel layer.

EXAMPLE 2

The metal compound solution was prepared by stirring for a predetermined time after adding indium chloride (InCl3) and glycine in a solvent, ethanol.

The same condition as Example 1 was performed to form an oxide thin film including indium oxide and the thin film transistor was manufactured by forming the oxide thin film as a channel layer.

Characteristic Measurement

FIG. 4 is a graph illustrating a transfer curve of the thin film transistor manufactured according to Example 1 and Example 2. The graph represents current Id flowing through the oxide semiconductor layer including indium oxide according to application of gate voltage Vg.

Referring to FIG. 4, when the precursor composition for the oxide semiconductor includes glycine, the charge mobility degree of the thin film transistor is about 0.1 cm2/Vs and an on-off current ratio is about 10⁷ or more and when the precursor composition for the oxide semiconductor includes serine, the charge mobility degree of the thin film transistor is about 0.58 cm2/Vs and an on-off current ratio is about 10⁷ or more.

Although not shown in the graph of FIG. 4, exemplary embodiments of the present invention may further include that when the precursor composition for the oxide semiconductor includes proline to manufacture the thin film transistor, the charge mobility degree of the thin film transistor is about 2.2 cm2/Vs and an on-off current ratio is about 10⁷ or more.

As described above, an oxide semiconductor layer manufactured by methods in accordance with exemplary embodiments of the present invention have performance suitable for forming a channel area of a thin film transistor (TFT).

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a thin film transistor array panel, comprising:
    preparing a metal compound solution which comprises a metal complex compound formed by a metal ion and an organic ligand and a solvent;
    coating the metal compound solution on a substrate;
    preprocessing the metal compound solution coated on the insulation substrate by irradiating ultraviolet rays thereon; and
    heat-treating the preprocessed metal compound solution coated on the substrate,
    wherein the metal complex compound is represented by the following Formula 1:

MAn    (Formula 1)

wherein M is the metal ion, A is the organic ligand and comprises α-substituted carboxylate, and n is a natural number.

2. The method of claim 1, wherein:
    the heat-treating of the metal compound solution is performed at the temperature of no greater than about 250° C.

3. The method of claim 1, wherein:
    in Formula 1, A comprises at least one of α-substituted amino acid, α-substituted hydroxyl acid, α-substituted keto acid, and α-substituted thio acid.

4. The method of claim 3, wherein:
    the Formula 1 comprises a compound represented by the following Formula 2:

(Formula 2)

wherein M is the metal ion, X comprises at least one of NH₂, OH, O, and SH, R is hydrogen (H) or an alkyl group, and n is a natural number from 1 to 3.

5. The method of claim 4, wherein:
    the metal ion comprises at least one of zinc (Zn), tin (Sn), indium (In), gallium (Ga), lithium(Li), sodium (Na), potassium (K), rubidium (Rb), cesium (Cs), beryllium (Be), aluminum (Al), barium (Ba), zirconium (Zr), hafnium (Hf), vanadium(V), yttrium (Y), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), gold (Au), mercury (Hg), boron (B), thallium (Tl), silicon (Si), phosphorus (P), arsenic (As), lanthanum (La), cerium (Ce), gadolinium (Gd), neodymium (Nd), tellurium (Te), scandium (Sc), polonium (Po), praseodymium (Pr), terbium (Tb), dysprosium (Dy), holmium (Ho), europium (Eu), erbium (Er), and ytterbium (Yb).

6. The method of claim 5, wherein:
    a mole ratio of the metal ion and the organic ligand is about 1:0.2 to about 1:10.

7. The method of claim 3, wherein:
    the α-substituted amino acid comprises at least one of alanine, serine, glycine, cysteine, proline, and sarcosine.

8. The method of claim 3, wherein:
the α-substituted hydroxyl acid comprises one of 2-hydroxy acetic acid and lactic acid.

9. The method of claim 3, wherein:
the α-substituted keto acid comprises one of pyruvic acid and glyoxylic acid.

10. The method of claim 3, wherein:
the α-substituted thio acid comprises one of thiolactic acid and thioglycolic acid.

11. The method of claim 1, wherein A comprises an α-substituted amino acid comprising at least one of alanine, serine, cysteine, proline, and sarcosine, and wherein a mole ratio of the metal ion and the organic ligand is about 1:0.2 to about 1:10.

12. The method of claim 1, wherein A comprises one of 2-hydroxy acetic acid or thioglycolic acid, and wherein a mole ratio of the metal ion and the organic ligand is about 1:0.2 to about 1:10.

13. A method of manufacturing a thin film transistor array panel, comprising:
forming a gate electrode on an insulation substrate;
forming a gate insulating layer on the gate electrode;
forming a source electrode and a drain electrode on the gate insulating layer;
forming a metal compound solution by mixing together a metal complex compound composed of a metal ion and an organic ligand and a solvent;
coating the metal compound solution on the insulation substrate;
preprocessing the metal compound solution coated on the insulation substrate by irradiating the metal compound solution with ultraviolet rays;
heat-treating the metal compound solution at a temperature no greater than 250° C. after the preprocessing of the metal compound solution;
cooling the metal compound solution at room temperature after the heat-treating of the metal compound solution to form an oxide semiconductor layer including metal oxide on the insulation substrate;
etching the oxide semiconductor layer including metal oxide such that only a portion of the oxide semiconductor layer including metal oxide remains on the insulation substrate, wherein the metal complex compound is represented by the following Formula 1:

$$MA_n \qquad \text{(Formula 1)}$$

wherein M is the metal ion, A is the organic ligand and comprises a-substituted carboxylate, and n is a natural number.

14. The method of claim 13, wherein the coating of the metal compound solution on the insulating substrate is performed after the source electrode and the drain electrode are formed on the gate insulating layer such that the metal compound solution is coated directly on the source electrode, the drain electrode and the gate insulating layer and wherein the oxide semiconductor layer including metal oxide is formed directly on the source electrode, the drain electrode and the gate insulating layer.

15. The method of claim 13, wherein the coating of the metal compound solution on the insulating substrate is performed after the gate insulating layer is formed on the gate electrode but prior to the source electrode and the drain electrode being formed on the gate insulating layer such that the metal compound solution is coated directly on the gate insulating layer and wherein the oxide semiconductor layer including metal oxide is formed directly on the gate insulating layer and the source electrode and the drain electrode are subsequently directly formed on the oxide semiconductor layer including metal oxide.

16. The method of claim 13, wherein A comprises an α-substituted amino acid comprising at least one of alanine, serine, cysteine, proline, and sarcosine, and wherein a mole ratio of the metal ion and the organic ligand is about 1:0.2 to about 1:10.

17. The method of claim 13, wherein A comprises one of 2-hydroxy acetic acid or thioglycolic acid, and wherein a mole ratio of the metal ion and the organic ligand is about 1:0.2 to about 1:10.

* * * * *